United States Patent Office 3,597,290

Patented Aug. 3, 1971

3,597,290

METHOD FOR CHEMICALLY DISSOLVING METAL

Akira Naito, Tokyo, Yukiya Masuda, Urawa-shi, Shigeo Osawa, Tokyo, Ryozo Kato, Iruma-gun, Saitama-ken, and Kazuo Motegi, Tokyo, Japan, assignors to Mitsubishi Edogawa Kagaku Kabushiki Kaisha, Tokyo, Japan No Drawing. Filed Mar. 25, 1968, Ser. No. 715,580
Int. Cl. C23f *1/02;* H05k *3/06;* C09k *3/00*
U.S. Cl. 156—18 6 Claims

ABSTRACT OF THE DISCLOSURE

The present invention provides a new and improved method for chemically dissolving metal, especially, copper. According to the invention, a solution containing acid, hydrogen peroxide and saturated lower aliphatic alcohol is used for dissolving metal, especially copper. Moreover, if either or both of a catalytic amount of a metal ion, which has lower oxidation potential than that of copper, and a nitrogen compound comprising a bonding group to metal is added to said solution, the present invention is more effectively performed.

The present invention relates to a method for chemically dissolving metal, and more particularly to a method of dissolving copper with acidified hydrogen peroxide in the etching of copper metal.

The present inventors formerly invented a method for chemically polishing copper and copper alloy as disclosed in the U.S. application Ser. No. 655,009. In the present invention a part of the basic principle of the previous invention is applied to the etching of copper.

Etching of copper has a broad range of applications. One of the most important applications is the etching of copper plate in the manufacture of printed circuits for electric and electronic industry.

In the known art for manufacturing a printed circuit, a copper clad laminate which is a laminate of a copper foil on a sheet of plastic is employed. The exposed surface of the copper is treated with a protective coating material or so called a resist so that a pattern is formed on said surface. Then the remaining exposed copper surfaces are removed by treating them with an etchant which chemically dissolves away the unprotected copper.

Usual protective coatings are performed by printing a pattern with a protective ink or by photo-printing a pattern with a photo sensitive resin on the surface of copper. Solder protective coating or solder resist is sometimes employed by forming a reverse pattern on the surface of the copper to be treated with an ink or resin and then plating the exposed copper surfaces with solder and thereafter removing the reverse pattern by dissolving it with a solvent.

In the case where organic resists are employed, an aqueous ferric chloride is the most usual and most widely used etchant.

However, ferric chloride has a significant disadvantage that it presents a problem of the difficulty in the disposal of the spent liquor containing iron and copper which is not easily recovered from the waste solution.

In the case where a solder or metal resist is used, ferric chloride is not employable since it attacks the solder resist and if the metal resist is not attacked, it causes a sharp side etch or undercut to the copper below the protective coating.

Hence, other etchants such as chrome-sulfuric acid and ammonium persulfate are employed by some users. Chrome-sulfuric acid is employed to some extent in the etching of copper with solder or gold resist, but this also presents the disposal problem. Ammonium persulfate has several advantages over ferric chloride, such as it is used for the etching of copper with a solder resist without any problem or it permits the recovery of copper from the spent solution and eliminates the disposal problem. However, there are disadvantages with ammonium persulfate and one of the most significant drawbacks of it as an etchant is its low etching capacity. Ammonium persulfate contains only one active oxygen atom in a considerably large molecule and therefore its oxidizing capacity, namely copper dissolving capacity per unit weight, is low. In addition, the etching rate with ammonium persulfate is rather low and difficult to control. When copper is dissolved to some extent in the ammonium persulfate solution, the etching rate is significantly retarded, and therefore it is difficult to maintain the etching rate to a substantially same level. Another disadvantage is that copper sulfate formed by the dissolution of copper tends to crystallize out in the ammonium persulfate solution which brings about several inconveniences.

It is known that an acidified hydrogen peroxide dissolves copper or copper alloy. However, there has not been a practical method for etching copper with hydrogen peroxide. Most difficult problem in the use of hydrogen peroxide for dissolving metal is the stabilization of the solution. As is well known, the stability of hydrogen peroxide solution is greatly decreased by the presence of heavy metal ions in the solution. The stabilization problem becomes most significant when hydrogen peroxide is used as an etchant for copper since dissolved copper forms highly active copper ion and it decomposes hydrogen peroxide very rapidly.

In general, it is desirable that the etching rate does not change largely throughout the operation, and that a rather large quantity of metal can be treated before the etching rate of the etching solution decreases to a low rate which is not practical any more.

An object of the present invention is to provide a novel and improved chemical solution containing hydrogen peroxide which is effectively employed for dissolving metal, particularly copper, and is substantially stable when contaminated with heavy metal ions. Another object of the present invention is to provide a new and improved method for dissolving metal in the etching of copper.

A further object is to provide a practical method for etching copper for a constructive purpose in the manufacture of printed circuits. Other objects and advantages of the present invention will be understood from the following descriptions.

According to the present invention it has been found that a solution containing one or more acids, hydrogen peroxide and one or more saturated lower aliphatic alcohols dissolves copper in a very practical and efficient manner. It has been also found that the addition of a catalytic amount of a metal ion which has lower oxidation potential than that of copper to the above mentioned solution greatly increases the dissolving rate without affecting the features of the solution. It has been also found that the addition of a nitrogen compound having a bonding group to metal, which is generally known to minimize undercutting when added to an etching solution, is also effective in the present invention.

The present invention for chemically dissolving copper is accomplished by treating copper with a solution containing 1–14% of hydrogen peroxide by weight, 0.5–5 g. hydrogen ion per liter and preferably catalytic amount of a metal ion which has lower oxidation potential than that of copper and optionally a nitrogen compound having a bonding group to copper, at a temperature between 40 and 60° C.

In the U.S. patent application Ser. No. 665,009, the present inventors have described the remarkable stabilizing effect to hydrogen peroxide of a saturated aliphatic alcohol in a solution containing hydrogen peroxide and copper ion. In the present invention also the stability of etching solution containing hydrogen peroxide is greatly improved when a saturated aliphatic alcohol or a mixture thereof is added thereto. Saturated lower alcohols are especially highly effective in improving the stability of etch solution and thereby improving the capacity of the acid-peroxide solution. Saturated lower alcohols such as methanol, ethanol, propanol, butanol and the like are employable in the present invention, and butanol is most preferable in the case of etching copper. The stability of the acid hydrogen peroxide solution in the present invention with the addition of 1 percent of butanol is as high as 96–98% during 3 hours period at 50° C. even when the copper concentration reaches as high as 6–8 percent by weight. This is to say that the loss of hydrogen peroxide due to decomposition was only 2–4 percent in 3 hours and was practically negligible even after a large amount of copper was dissolved into the etch solution.

As to the concentration of alcohol, from 0.1 percent to the solubility of the alcohol employed may be used, but from 0.1 to 5 percent is practical and from 0.5 to 2% is most preferable.

In the present invention the concentration of hydrogen peroxide in the acidified hydrogen peroxide solution for the dissolution of metal may be varied over a considerably wide range, but the desirable concentration is from 1 to 14 percent by weight. When the concentration of hydrogen peroxide is less than 1 percent, the etching rate is impracticably low and moreover uniform etching can not be expected at this concentration. When the concentration exceeds 14 percent, although etching can be carried out, the decomposition of hydrogen peroxide due to the dissolved copper becomes to such an extent that the operation is not economical. This high decomposition rate is brought about by the high hydrogen peroxide concentration together with the high concentration of the dissolved copper.

The acid concentration in the method of the present invention may be varied over a considerably wide range. In the etching of copper it is desirable that the etch solution contains from 0.5 to 5 g., preferably 0.6 to 4 g. per liter of $H^+$ ion. When hydrogen ion concentration is less than 0.5 g. per liter, the etch rate is low and the decomposition of hydrogen peroxide in the etch solution is high. This tendency is especially remarkable with an etching solution in which more than about half of the components have been already consumed for the dissolution of copper.

The upper limit of hydrogen ion concentration depends upon several factors such as the kind or kinds of acid employed. The concentration exceeding 5 g. per liter of $H^+$ ion is not economical and there is a tendency that the etching rate is rather lowered when the hydrogen ion concentration exceeds this level.

Almost all kinds of acids, such as mineral acids and strong organic acids, except hydrohalic acids may be employed as the acid of the present invention, but from the economical stand point of view, sulfuric acid, nitric acid and phosphoric acid are preferable and sulfuric acid is the most preferable.

The metal ion employed in the present invention is a metal ion that has lower oxidation potential than that of the metal to be dissolved. In the case of the etching of copper, such ions as silver, mercury, palladium gold and platinum ions may be used. These metals may be employed in the concentrations of 50 to 500 p.p.m. as ion and preferably from 100 to 300 p.p.m. As to the form of addition, the salts of metals which are dissolved in an aqueous solution of acid hydrogen peroxide are employed. And the salts include nitrates, sulfates, chlorides, chlorates or complex salts.

It is known that a halogen ion, if contained in large amount, retards the etching of copper and in this regard it is not desirable that the salts provide large amounts of halogen in the solution. However, if a metal ion is utilized in a rather low concentration, a chloride or halogen containing salt may be used. The most preferable examples are nitrates of silver and mercury and sulfates of silver and mercury.

It is meant in the present invention by the "bonding group to metal of a nitrogen compound" added as an inhibitor for undercutting, a nitrogen containing group which has a high electron density and a bonding ability to metals such as $\equiv N$, $=N$, $—NH_2$. Examples of the compounds containing these groups include urea, pyridine, amines and acidamides. These compounds are employed in the concentrations of 0.01–2% and markedly improve the undercutting problem.

Temperature of the acid-hydrogen peroxide is an important factor for etching copper. It is not practical to use room temperature for the etching of copper. The practical temperature is between 40 and 60° C. It is most practical to begin the etching at a temperature around 40° C. and then employ the higher temperatures as the etching proceeds, and copper concentration in the solution increases. Since the dissolving of copper is an exothermic reaction and the bath temperature raises, the control of the temperature in such as way as above is easily carried out by slightly heating or cooling depending upon the state of the bath with respect to heat transfer. By keeping the temperature so, the etching rate is maintained to a substantially constant level throughout the operation.

The present invention has several outstanding features. One of them is remarkably high stability of hydrogen peroxide in an etch solution.

It has been known that such compounds exert stabilizing effect in acid hydrogen peroxide as urea, aminopyridine, 8-hydroxy quinoline, phenacetin, sulfathiazole and antipyrine, however the stabilizing effect of these compounds is not as satisfacory as the alcohols proposed in the present invention. Moreover, if sulfathiazole is employed together with silver ion as is proposed in the U.S. Pat. No. 3,293,093, even if the etch rate and the stability of the solution is satisfactory, there arises another problem that silver sulfide formed during etching tends to deposit on the exposed plastic surface of etched board and thereby degrade the electric properties of the formed circuit. On the contrary the alcohols proposed in the present invention do not react with metal ions to form insoluble products and hence no alike problem is encountered in the present invention.

An other important feature of the present invention is the high etching rate which is significantly greater than the etching rate realized by ammonium persulfate. Still an other outstanding feature of the present invention is the high etching capacity of the acid hydrogen peroxide solution. It is possible to dissolve in accordance with the present invention as high as 60 to 90 grams of copper with one liter of solution.

Further an other feature of the method of the present invention is that it is applicable to both organic resists and metal resist such as solder or nickel, in all sorts of etching apparatus such as immersion, spray or puddle etchers.

Another important feature of the present invention is its remarkable economy. The price of hydrogen peroxide is significantly lower than that of ammonium persulfate especially when compared as the price per active oxygen. As the greater part of the hydrogen peroxide contained in the etching solution of the present invention is effectively consumed for the dissolution of copper, there is a significant difference in the costs of eaching between the method of the present invention and the conventional ammonium persulfate method.

It is also another important feature that the recovery of copper is easily carried out from the etching solution of the present invention. A particular feature of the present invention is that it may be utilized effectively and efficiently in the manufacturing of printed circuits involving the etching of copper clad laminates. The present method is especially suitable for the manufacture of precise circuits as the method provides high reliablity in regard to the dimension of the pattern or the circuit formed.

The following examples are not limitative, but only for the purpose of illustration.

On the following examples percent is expressed by weight. The tap water used contained 5 p.p.m. of $Cl^-$.

EXAMPLE 1

A printed circuit board was made with a copper clad paper-phenolic laminate on which a pattern was printed by a silk screen process.

The thicknes of the copper foil was 35$\mu$.

The result of etching by employing a puddle etcher of 1 liter capacity is shown below.

Composition of etchant:

| | Percent |
|---|---|
| $H_2O_2$ | 8.02 |
| $H_2SO_4$ | 17.25 |
| n-Butanol | 1 |
| Deionized water | 73.73 |

Relation of etching time and concentration of dissolved copper:

| Concentration of dissolved copper (percent): | Etching time (min.) |
|---|---|
| 0 | 0.92 |
| 2 | 1.35 |
| 4 | 2.40 |
| 6 | 5.10 |
| 8 | 19.6 |

| | Percent |
|---|---|
| Effective consumption of hydrogen perioxide | 58.45 |
| Decomposition of hydrogen peroxide | 25.70 |
| Remaining hydrogen peroxide | 15.85 |

EXAMPLE 2

A copper clad glass-epoxy laminate on which a pattern was printed by a silk screen process was etched in a puddle etcher of 1 liter capacity. The thickness of the copper foil was 35$\mu$. The following results were obtained.

Composition of etchant:

| | Percent |
|---|---|
| $H_2O_2$ | 8.02 |
| $H_2SO_4$ | 17.41 |
| n-Butanol | 1.0 |
| Tap water (containing 5 p.p.m. of $Cl^-$) | 73.57 |

Relation of etching time and concentration of dissolved copper:

| Concentration of dissolved copper (percent): | Etching time (min.) |
|---|---|
| 0 | 1.1 |
| 2 | 1.65 |
| 4 | 3.8 |
| 6 | 9.1 |

| | Percent |
|---|---|
| Effective consumption of hydrogen peroxide | 54.69 |
| Decomposition of hydrogen peroxide | 32.60 |
| Remaining hydrogen peroxide | 12.71 |

The results of Example 1 and Example 2 above shows that halogen ion lowers somewhat the etching rate. Further, the decrease in the etching rate results in increase in the decomposition of $H_2O_2$ and the effective consumption of hydrogen peroxide decreases to some extent.

EXAMPLE 3

A printed circuit board was made with a copper clad paper-phenolic laminate on which a pattern was photoprinted with K.P.R photo-resist. The results of eaching the printed circuit board in a puddle etcher of 1 liter capacity are shown below.

Composition of etchant:

| | | |
|---|---|---|
| $H_2O_2$ | percent | 7.98 |
| $H_2SO_4$ | do | 17.42 |
| n-Butanol | do | 1 |
| Tap water | do | 73.6 |
| $AgNO_3$ | p.p.m. | 26 |

Relation of etching time and concentration of dissolved copper:

| Concentration of dissolved copper (percent): | Etching time (min.) |
|---|---|
| 0 | 2.42 |
| 2 | 3.53 |
| 4 | 5.3 |
| 6 | 8.3 |
| 8 | 13.5 |

| | Percent |
|---|---|
| Effective consumption of hydrogen peroxide | 63.68 |
| Decomposition of hydrogen peroxide | 30.10 |
| Remaining hydrogen peroxide | 6.22 |

EXAMPLE 4

A precise circuit board made by a silk screen printing on a copper clad glass-epoxy laminate was etched by a puddle etcher. The result is shown below.

Composition of etchant:

| | Percent |
|---|---|
| $H_2O_2$ | 7.98 |
| $H_2SO_4$ | 17.65 |
| n-Butanol | 1 |
| Tap water | 73.35 |
| $HgSO_4$ | 0.025 |

Relation of etching time and concentration of dissolved copper:

| Concentration of dissolved copper (percent): | Etching time (min.) |
|---|---|
| 0 | 1.17 |
| 2 | 1.40 |
| 4 | 1.70 |
| 6 | 2.30 |
| 8 | 3.60 |
| 9 | 5.10 |

| | Percent |
|---|---|
| Effective consumption of hydrogen peroxide | 78.40 |
| Decomposition of hydrogen peroxide | 21.60 |
| Remaining hydrogen peroxide | 0 |

EXAMPLE 5

A pattern opposite to that of the circuit to be formed was printed on a copper clad glass-epoxy laminate and the part of the circuit was plated by solder. Then the printed ink was removed and the etching was effected by a 1 l. puddle etcher. The result is shown below.

Composition of etchant:

| | Percent |
|---|---|
| $H_2O_2$ | 8.02 |
| $H_2SO_4$ | 17.41 |
| n-Butanol | 1 |
| Tape water | 73.55 |
| $AgNO_3$ | 0.02 |

Relation of etching time and concentration of dissolved copper:

| Concentration of dissolved copper (percent): | Etching time (min.) |
|---|---|
| 0 | 0.92 |
| 2 | 1.25 |
| 4 | 1.78 |
| 6 | 2.90 |
| 8 | 5.0 |
| 9 | 7.25 |

| | Percent |
|---|---|
| Effective consumption of hydrogen peroxide | 73.70 |
| Decomposition of hydrogen peroxide | 25.9 |
| Remaining hydrogen peroxide | 0.4 |

EXAMPLE 6

An electronic computer circuit board printed with K.P.R. photosensitive resin on a copper clad glass-epoxy laminate (copper foil of 35μ thick) was etched by using a 1 l. puddle etcher. The result is shown below.

| | Percent |
|---|---|
| $H_2O_2$ | 7.98 |
| $H_2SO_4$ | 17.65 |
| n-Butanol | 0.8 |
| $HgSO_4$ | 0.02 |
| Phenacetin | 0.02 |
| Tap water | 73.33 |

Etching time and concentration of dissolved copper:

| Concentration of dissolved copper (percent): | Etching time (min.) |
|---|---|
| 0 | 1.33 |
| 2 | 1.51 |
| 4 | 1.82 |
| 6 | 2.50 |
| 8 | 3.80 |
| 9 | 5.20 |
| 10 | 8.0 |

| | |
|---|---|
| Effective consumption of hydrogen peroxide percent | 72.31 |
| Decomposition of hydrogen peroxide do | 18.3 |
| Remaining hydrogen peroxide do | 9.39 |
| Etch coefficient of the circuit board | 2.1 |

EXAMPLE 7

A multilayer circuit board for electronic computer made by printing a photosensitive resin on a copper clad glass-epoxy laminate (copper foil of 70μ in thickness) was etched by a spray etcher. The result is shown below.

Composition of etchant:

| | Percent |
|---|---|
| $H_2O_2$ | 8.7 |
| $H_2SO_4$ | 17.5 |
| n-Propanol | 1 |
| n-Butanol | 0.5 |
| Urea | 1 |
| $AgNO_3$ | 0.02 |
| Tap water | 71.28 |

Relation of etching time and concentration of dissolved copper:

| Concentration of dissolved copper (percent): | Etching time (min.) |
|---|---|
| 0 | 1.5 |
| 2 | 2.0 |
| 4 | 4.0 |
| 6 | 7.0 |
| 8 | 8.0 |
| 9 | 10.5 |

| | |
|---|---|
| Effective consumption of hydrogen peroxide percent | 73.5 |
| Decomposition of hydrogen peroxide do | 26.0 |
| Remaining hydrogen peroxide do | 0.5 |
| Etch coefficient of the circuit board | 1.8–2.1 |

EXAMPLE 8

A printed circuit was made with a copper clad glass-epoxy laminate on which a pattern was formed with solder resist and etched by a spray etcher. The following results were obtained.

Composition of etchant:

| | Percent |
|---|---|
| $H_2O_2$ | 8.0 |
| $H_2SO_4$ | 16.5 |
| $H_3PO_4$ | 5.0 |
| n-Butanol | 1.0 |
| Urea | 1.0 |
| $AgNO_3$ | 0.02 |
| Tap water | Balance |

Relation of etching time and concentration of dissolved copper:

| Concentration of dissolved copper (percent): | Etching time (min.) |
|---|---|
| 0 | 1.0 |
| 2 | 1.4 |
| 4 | 2.0 |
| 6 | 3.9 |
| 8 | 6.6 |
| 9 | 9.0 |

| | Percent |
|---|---|
| Effective consumption of hydrogen peroxide | 72.0 |
| Decomposition of hydrogen peroxide | 24.0 |

The present invention is not to be limited to the above illustrative embodiment, but there are other modifications within the scope of the appended claims.

What is claimed is:

1. Method for chemically dissolving copper which comprises treating copper with a solution containing by weight 1% to 14% hydrogen peroxide, at least 0.1% of a saturated lower aliphatic alcohol and at least one acid of the class consisting of sulfuric acid and phosphoric acid, said treating being carried out at a temperature of from 40° C. to 60° C., wherein the concentration of acid in said solution ranges from 17% to 215% by weight.

2. Method according to claim 1, in which the hydrogen peroxide solution contains additionally a catalytic amount of at least one kind of metal ion which has lower oxidation potential than that of copper.

3. Method according to claim 1, in which the hydrogen peroxide solution contains additionally at least one kind of nitrogen compound having at least one bonding group to copper.

4. Method according to claim 1, in which the hydrogen peroxide solution contains additionally a catalytic amount of at least one kind of metal ion which has lower oxidation potential than that of copper and at least one kind of nitrogen compound having at least one bonding group to copper.

5. Method according to claim 2 wherein said metal ion is at least one of the class consisting of silver, mercury, palladium, gold and platinum.

6. Method according to claim 3 wherein said nitrogen compound is at least one of the class consisting of urea, pyridine, amines and acid amides.

References Cited

UNITED STATES PATENTS

| | | | |
|---|---|---|---|
| 3,293,093 | 12/1966 | Jones et al. | 156—18 |
| 3,407,141 | 10/1968 | Bonush et al. | 252—79.4 |

JACOB STEINBERG, Primary Examiner

U.S. CL. X.R.

156—3; 252—79.4